US011782072B2

United States Patent
Moreira et al.

(10) Patent No.: US 11,782,072 B2
(45) Date of Patent: Oct. 10, 2023

(54) TEST ARRANGEMENT FOR TESTING HIGH-FREQUENCY COMPONENTS, PARTICULARLY SILICON PHOTONICS DEVICES UNDER TEST

(71) Applicant: Advantest Corporation, Tokyo (JP)

(72) Inventors: José Moreira, Stuttgart (DE); Zhan Zhang, San José, CA (US); Hubert Werkmann, Leinfelden-Echterdingen (DE); Fabio Pizza, Longone al Segrino (IT); Paolo Mazzucchelli, Magenta (IT)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 17/744,453

(22) Filed: May 13, 2022

(65) Prior Publication Data
US 2022/0276280 A1    Sep. 1, 2022

Related U.S. Application Data

(60) Division of application No. 17/085,408, filed on Oct. 30, 2020, now Pat. No. 11,561,242, which is a continuation of application No. PCT/EP2020/058634, filed on Mar. 26, 2020.

(51) Int. Cl.
| | | |
|---|---|---|
| *G01R 1/04* | (2006.01) |
| *G01R 1/067* | (2006.01) |
| *G01R 1/073* | (2006.01) |
| *G01R 31/28* | (2006.01) |
| *G01R 31/317* | (2006.01) |

(52) U.S. Cl.
CPC ..... *G01R 1/06772* (2013.01); *G01R 1/07314* (2013.01); *G01R 31/2834* (2013.01)

(58) Field of Classification Search
CPC .......... G01R 1/04; G01R 1/067; G01R 1/073; G01R 31/00; G01R 31/02; G01R 31/28; G01R 31/317
See application file for complete search history.

(56) References Cited

U.S. PATENT DOCUMENTS

| 6,900,649 | B1 | 5/2005 | Knauer | |
| 2003/0076124 | A1* | 4/2003 | Zaiser | G01R 1/07307 |
| | | | | 324/756.04 |

(Continued)

FOREIGN PATENT DOCUMENTS

| EP | 0999450 A1 | 5/2000 |
| JP | 2010122139 A | 6/2010 |
| TW | 201109672 A | 3/2011 |

*Primary Examiner* — Neel D Shah (57) ABSTRACT

The invention relates to a probe card (PC) for use with an automatic test equipment (ATE), wherein the probe card (PC) comprises a probe head (PH) on a first side thereof, and wherein the probe card (PC) is adapted to be attached to an interface (IF) and wherein the probe card (PC) comprises a plurality of contact pads on a second side in a region opposing at least a region of the interface (IF), arranged to contact a plurality of contacts of the interface (IF), and wherein the probe card (PC) comprises one or more coaxial connectors (CCPT) arranged to mate with one or more corresponding coaxial connectors (CCPT) of the interface (IF). The invention relates further to pogo tower (PT) for connecting a wafer probe interface (WPI) of an automatic test equipment with the probe card (PC).

18 Claims, 7 Drawing Sheets

(56) References Cited

U.S. PATENT DOCUMENTS

2006/0109015 A1\* 5/2006 Thacker ................... G02B 6/12
　　　　　　　　　　　　　　　　　　　　324/755.07
2006/0255821 A1\* 11/2006 Goto ................. G01R 31/2889
　　　　　　　　　　　　　　　　　　　　324/750.14

\* cited by examiner

TEST ARRANGEMENT FOR TESTING HIGH-FREQUENCY COMPONENTS, PARTICULARLY SILICON PHOTONICS DEVICES UNDER TEST

RELATED APPLICATION(S)

This application is a Divisional Application of, and claims priority to co-pending, commonly-owned U.S. patent application Ser. No. 17/085,408, filed Oct. 30, 2020, entitled "Test Arrangement for Testing High-Frequency Components. Particularly Silicon Photonics Devices Under Test," to Moreira, et al., which in turn was a Continuation of PCT Application Number PCT/EP2020/058634, filed Mar. 26, 2020. All such applications are hereby incorporated herein by reference in their entireties.

DESCRIPTION

Technical Field

Embodiments according to the invention relate to a probe card for use with an automatic test equipment, a pogo tower for connecting a wafer probe interface of the automatic test equipment with a probe card, the automatic test equipment and a method for testing a device under test using said automatic test equipment.

Background of the Invention

Automatic test equipment is widely used in the electronic manufacturing industry to test electronic components and systems after being fabricated. The device being tested is known as a device under test. Automatic test equipment quickly performs measurements and evaluates the test results. This is specifically necessary in the semiconductor industry where automatic test equipment can test a wide range of electronic devices and systems from single components to complex and completely assembled electronic systems. For such a purpose, probe cards are used. Automatic test equipment systems are designed to reduce the amount of test time needed to verify that a particular device under test works or to quickly find its faults before the part has a chance to be used in a final consumer product. Therefore, to reduce manufacturing costs and improve yield, semiconductor devices should be tested after being fabricated to prevent defective devices ending up with the consumer. Conventional automatic test equipment consists of a master controller—usually a computer—that synchronizes one or more source- and capture-instruments while the device under test is physically connected to the automatic test equipment using another device called a handler or a prober having a customized interface that adapts the automatic test equipment resources to the device under test. The automatic test equipment can be used on packaged parts— typical integrated circuit 'chip'—or directly on a silicon wafer. Packaged parts use a handler to place the device on a customized interface board, whereas silicon wafers are tested directly with high precision probes. The automatic test equipment systems interact with the handler or prober to test the device under test.

Devices under test can be highly complex setting challenging standards to automatic test equipment. Testing a device for all parameters may or may not be required depending on the device functionality and end user. For example, if the device finds application in medical or life-saving products then many of its parameters must be tested, and some of the parameters must be guaranteed. Specifically, photonic chips or hybrids thereof represent a particular challenge, since testing high-speed/high-frequency pins of a silicon photonics device under test at a wafer testing level in a high-volume production is only possible in separate process steps using different testing devices. A big challenge is testing a die's electrical and photonics side simultaneously. Different solutions have been developed to test silicon photonics chips but do not allow for testing high-speed/high-frequency pins of a silicon photonic part of a device under test in a reliable manner, since a failure coverage is very limited especially on the modulator part of the Photonics Circuit.

Therefore, it is desirable to provide a concept for reliable testing high-speed digital/high-frequency pins of a photonics device under test at wafer level in a high-volume production test cell.

This is achieved by the subject-matter of the independent claims of the present application, implying a high-volume production test cell using a standard wafer tower setup and allowing at the same time to test the standard digital/power pins as well as the photonic pins using for example a fiber array.

Further embodiments according to the invention are defined by the subject-matter of the claims of the present application.

SUMMARY OF THE INVENTION

A solution for the wafer probing test fixture design is to connect the wafer probe interface directly to a test fixture.

An aspect according to this invention is related to a probe card for use with an automatic test equipment, wherein the probe card comprises a probe head on a first side thereof, for example, for contacting a device under test, i.e. a photonic chip or hybrid thereof, and wherein the probe card is adapted to be attached to an interface. The interface may be attached mechanically and/or electrically to the automatic test equipment or segments thereof—directly and indirectly. The probe card comprises a plurality of contact pads on a second side averted to the first side thereof in a region opposing at least a region of the interface, arranged to contact a plurality of contacts of the interface. The plurality of contacts of the interface can be, for instance, spring-loaded pins, in other words so-called pogo pins. Above that, the probe card comprises one or more coaxial connectors arranged to mate with one or more corresponding coaxial connectors of the interface, e.g. an automatic test equipment, in a region opposing at least another of the automatic test equipment segments or of coaxial cables for establishing a connection/communication with one or more high-frequency instruments. Main advantages of this approach is increased space available for items like relay or support circuitry, improved bandwidth, and the overall setup is closer to the final test fixture design, for example a packaged device under test Another aspect of the invention is a pogo tower for connecting a wafer probe interface of an automatic test equipment with a probe card, wherein the pogo tower comprises a plurality of pogo tower segments. The segments provide space for different measurement equipment, for example optical, analog and digital signals and/or free— cutout—regions. At least one of the pogo tower segments comprises one or more coaxial connectors arranged to connect the probe card with one or more coaxial cables for establishing a connection/communication with one or more instruments, for instance high-frequency instruments, on a side facing the probe card and at least another one of the pogo tower segments comprises a plurality of pogo pin contacts arranged to contact the probe card with the wafer probe interface.

This alternative test fixture of a wafer probing is typically composed of three elements. A wafer probe interface connects the automatic test equipment pin electronics—pogo pins—to a probe pogo tower. The pogo tower connects the wafer probe interface to a probe card. The probe card is a wafer probe interface board that contains the probes which connect to the device under test usually positioned on the center of the probing interface. This type of configuration can typically accommodate a new application or device with just the redesign of the probe card. The wafer probe interface in the pogo tower are normally application independent and designed by the automatic test equipment manufacturer since they are only dependent on the specifics of the automatic test equipment platform.

Another aspect of the invention is an automatic test equipment for testing/measuring a device under test, which comprises one or more low-speed signaling components and/or one or more high/speed signaling components enabling it to test/measure photonic chips or hybrids thereof but also conventional semiconductor integrated circuits. The automatic test equipment comprises:
a pogo tower comprising [the] features corresponding to the above-described pogo tower for connecting a wafer probe interface of an automatic test equipment with a probe card comprising [the] features corresponding to the above-described probe card;
one or more instruments, for example high-frequency instruments, for generating and/or receiving high-frequency signals and/or high-speed digital signals using one or more coaxial connectors of the pogo tower and/or one or more coaxial connectors of the probe card; one or more instruments, for example low-frequency instruments, and/or one or more power supplies configured to be coupled to the device under test via pogo pins of the pogo tower into contact pads of the probe card for exchanging low-frequency and/or low-speed digital signals;
one or more optical instruments, e.g. lasers and/or optical power meters, connected to one or more optical guides like fiber cables, attached thereto, and a positioning apparatus for establishing an optical coupling between the one or more optical instruments and the device under test, for example via the one or more optical guides.

According to an embodiment of the automatic test equipment each—one—of the wafer probe interface(s) of the automatic test equipment and/or the pogo tower and the probe card respectively have a recess region, wherein the recess regions are alignable—even aligned—with each other at least in a common partial area, whereby the recess regions allow for accommodation of the positioning apparatus in a space defined by the common partial areas. In other words, a common overlap area of the aligned recess regions defines the size of a reception area of the positioning apparatus.

According to an embodiment, the common partial area of the recess regions extends at least two a location adjacent to the device under test. A reception area extending adjacent to the device under test allows test equipment and probes to access or be positioned close to the device under test in order to directly measure/test minimizing transmission losses and time in order to allow the secure coupling between the device under test and probe/testing devices.

According to an embodiment, the positioning apparatus comprises a movable cantilever arm. The movable cantilever arm can be adjusted to securely couple the probe/testing devices like probes, probe head of a probe card and/or connectors with the device under test. Above that, different probes can be added throughout the testing/measuring of the device under test enabling for additional measurements and/or testing if or when required. The cantilever arm is configured to fully exploit all degrees of freedom of movement in order to establish a reliable connection between the automatic test equipment and the device under test.

According to an embodiment, the movable cantilever arm of the positioning apparatus extends at least to a location adjacent to the device under test. In order to benefit the advantages of short and direct connections/communication, additional functional flexibility can be achieved by enabling the cantilever to access and couple with the device under test in a secure and easy way.

According to an embodiment, the high-speed signaling instruments allow for signals with a frequency in a range of at least 25 GHz particularly preferred up to at least 70 GHz. High-speed signaling instruments which cover this bandwidth can be used for measuring and/or testing optical or photonics chips among others and/or conventional chips.

A particular advantage of using a cantilever for accessing high-speed connectors/connections of a device under test is to be able to test electrical and photonic parts of a die in quick succession one after another and/or simultaneously, since an alignment of the fiber array can be done fast so as to minimize test time.

Therefore, according to another embodiment, the device under test is a silicon photonics device or conventional semiconductor integrated circuit or hybrid between a silicon photonics device and a conventional semiconductor integrated circuit.

According to an embodiment, the wafer probe interface has a void—hole—in a region facing the pogo tower or the probe card for passing cables through. The void allows, for example, passing through coaxial cables, which can be attached to coaxial connectors of a high-frequency instrument.

According to an embodiment, one or more coaxial connectors are configured for blind-mating. For example, the connectors can have plugging receptacles with two side guideposts that are able to handle greater misalignment thereby ensuring a secure coupling/contact.

According to an embodiment, the coaxial cables protrude from the pogo tower or the probe card in a region facing the wafer probe interface. The specific arrangement allows a connection to a pogo tower or a direct connection with the wafer probe interface, whereby intermediate contacts—needed in case of an intermediary pogo tower—are bridged. Above that, the arrangement of the coaxial cables allows a connection to external test devices which can be added independently and separately from the automatic test equipment for complementary testing and/or measuring.

According to an embodiment, [the] pogo pins are non-core actual pogo pins. The use of coaxial pogo pins allows for a higher packaging density of the pogo pins and thus, for a higher measuring/data density. Therefore, exclusively non-coaxial pogo pins are used according to an embodiment of the pogo tower.

According to an embodiment, the automatic test equipment has a first operation mode configured to test one or more components of the device under test in a sequential/successive mode, and/or a second operation mode configured to test one or more components of the device under test in a simultaneous mode. In other words, the automatic test equipment is configured to test one or more low-speed signaling components and/or one or more high-speed signaling components according to a first operation mode and/or a second operation mode, thus being very flexible in use.

Another aspect of the invention relates to a method for testing the device under test using an automatic test equipment comprising the features of the automatic test equipment previously described, wherein the automatic test equipment applies either one of the following signals to one or more components of the device under test:
one or more low-speed signals, or
one or more high-speed signals, or
sequentially/successively one or more low-speed signals and one or more high-speed signals or vice versa, or
simultaneously one or more low-speed signals and one or more high-speed signals.

The method allows for testing/measuring devices under test comprising conventional semiconductor integrated circuits or silicon photonics devices or hybrids between a silicon photonics device and a conventional semiconductor integrated circuit.

Above that, an idea of the invention is an efficient use of conventional test equipment proposing a way to include high-speed/high-frequency pins to test silicon photonics integrated circuits while being fully compatible with, for example, a standard production pogo tower or a wafer probing setup fixture. Thereby, a testing/measurement of high-speed/high-frequency pins of a silicon photonics device under test at a wafer testing level in high volume production is made possible allowing for signals with a frequency in a range of at least 25 GHz and up to a frequency range of 70 GHz or above. Above that, the invention allows to test such pins still using a standard automatic test equipment pogo tower setup without major modification.

The probe card, pogo tower, automatic test equipment, and method for testing a device under test as described above are based on the same considerations, as they share the same or similar features which can be used alternatively or additionally. Therefore, for example, the method for testing a device under test can be completed with all features and functionalities, which are also described with regard to the probe card, pogo tower, or automatic test equipment for testing the device under test.

BRIEF DESCRIPTION OF THE DRAWINGS

The drawings are not necessarily to scale; emphasis instead is generally placed upon illustration of the principles of the invention. In the following description, various embodiments of the invention are described with reference to the following drawings in which.

DETAILED DESCRIPTION OF THE EMBODIMENTS

Equal or equivalent elements or elements with equal or equivalent functionality are denoted in the following description by equal or equivalent reference numerals even if occurring in different figures.

In the following description, a plurality of details is set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described herein after may be combined with each other, unless specifically noted otherwise.

Figure 1:
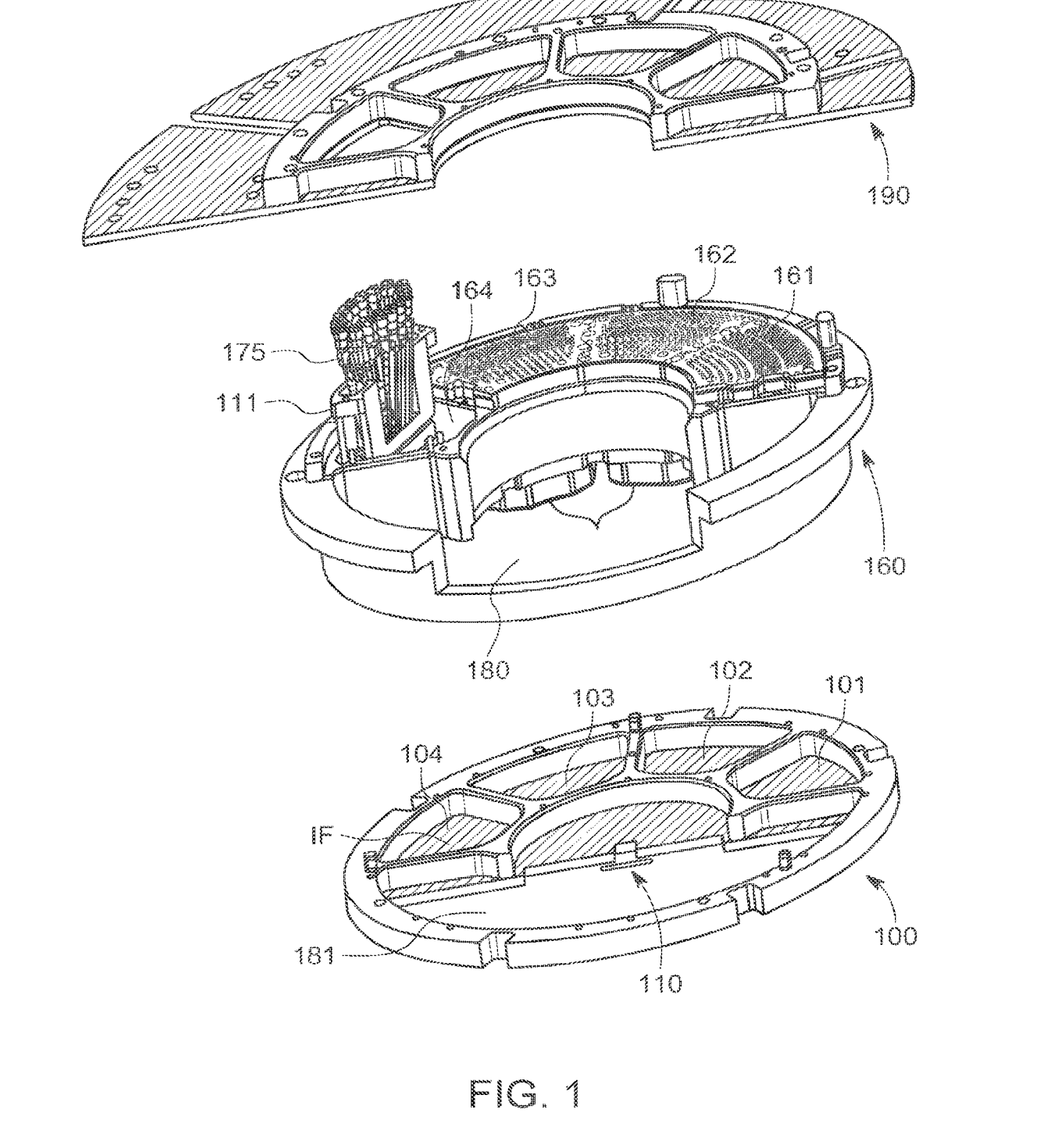
FIG. 1 shows an exploded view of a test fixture setup comprising a probe-card, pogo tower and a wafer probe interface according to an embodiment of the present invention.

According to FIG. 1, an exploded view of a typical test fixture setup comprising a probe card 100, pogo tower 160 and the wafer probe interface of 190 according to an embodiment of the present invention. The wafer probe interface 190 is configured to connect the automatic test equipment electronics to the probe pogo tower 160. The probe card 100 contains the probes which connect to the device under test DUT on the center of the probe card 100. In the example shown in FIG. 1, the probes are concentrated on a small area of a probe head 110. Both the pogo tower 160 and the probe card 100 are manufactured as printed circuit boards or comprise at least a printed circuit board. This type of configuration can typically accommodate every new application or device with just a redesign of the probe card 100. The wafer probe interface 190 and the pogo tower 160 are normally application independent and designed by the automatic test equipment manufacturers since they are only dependent on specifics of the automatic test equipment platform. FIG. 1 shows an example of a vertical probe card 100 for a high-speed digital application.

The probe card 100 according to FIG. 1 comprises a probe head 110 on a first side thereof for contacting a device under test DUT, specifically photonic chips or hybrids thereof. The probe card 100 comprises further a plurality of contact pads—not shown—on a second side thereof being averted to the first side (facing away from it). The plurality of contact pads is adapted to be contacted or connected to an opposing interface of the pogo tower 160 in at least alone region or area thereof by coupling the contact pads with contacts or connectors of the pogo tower 160, for example, pogo pins PP. In addition, the probe card 100 comprises one or more coaxial connectors 120 (FIGS. 2, 5) arranged to mate with one or more corresponding coaxial connectors of pogo tower 160, in a region opposing at least another of the automatic test equipment segments or of coaxial cables or coaxial connectors 120 for establishing a connection/communication with one or more instruments, for example, high-frequency instruments.

The contact pads as well as the coaxial connectors 120 are arranged in separate segments of the probe card 100, e.g., probe card segments 101, 102, 103, 104. According to an embodiment, there are provided individual probe card segments PCS for different contacts, i.e., pogo pins 165 and/or power supplies connectors 170 and/or coaxial connectors 175. The power supply connectors 170 may be pogo pins or other power-supply type connectors, in some embodiments. By selective separation of the different contacts and coaxial connectors 175 in individual probe card segments PCS, their mutual influence of different signals can be reduced.

The interface IF of the probe card 100 is adapted to be attached mechanically and/or electrically to the pogo tower 160 or an automatic test equipment ATE. According to an embodiment, the interface IF to which the probe card 100 is attachable is a pogo tower 160, which represents a critical path of a signal from the probe card 100 to the wafer probe interface 190 of the automatic test equipment ATE. Sometimes the pogo tower 100 is referred to as a spring probe tower comprising multiple pogo pins PP. The pogo tower 100 also comprises a plurality of pogo tower segments, e.g., 161, 162, 163, 164, which are designed to correspond in a complementary way to at least one or more probe card segments, e.g., 101, 102, 103, 104, of the probe card 100. The different probe card segments 101-104 as well as the corresponding pogo tower segments 161-164 enable flexibly adaptable solutions and products.

The embodiment according to FIG. 1 shows a probe card 100 and the pogo tower 160 having dedicated probe card segments 161-164 and dedicated pogo tower segments 161-164 for low-frequency signaling connections like a plurality of pogo pins, and high-frequency signaling connections like coaxial cables with coaxial connectors 120 (FIG. 2) and 175, as well as a segment defining a recess region or void 180. One or more coaxial connectors 175 within socket slot 111 (see also item 210 of FIG. 2) are adapted to connect the probe card 100 with one or more coaxial cables for establishing a connection/communication with one or more high-frequency instruments. The high-frequency instruments are adapted for generating and/or receiving high-frequency signals and/or high-speed digital signals using one or more coaxial cables connected to the coaxial connectors 175 of the pogo tower 160, and/or one or more coaxial connectors of the probe card 100 which are located in the interface IF—not shown. The high-speed signaling instruments allow for signals with a frequency in the range of at least 25 GHz, particularly preferred up to at least 70 GHz.

Pogo pins PP are spring pin contacts which cover a wide high-bandwidth-range with high compliance. Nevertheless, their use is restricted in case of high-speed digital signals or high-frequency signals beyond 5 GHz. In order to avoid the misalignment of the high-frequency/high-speed digital contacts, one or more coaxial connectors 120/175 are configured for blind mating, whereby plugging receptacles have two side guideposts. For the particular purpose to connect an optical fiber OF to a silicon die optical waveguide coupler, like on-chip grating coupler for vertical coupling, V-groove coupling, and edge-coupled optical fiber OF to on-chip waveguides are used. Dependent on the requirements of the tests and measurements, multiple laser sources can be used to provide different signaling. The optical side requires the fiber array to be aligned with precision on top of the grating coupler and the alignment of the fiber array needs to be done as fast as possible to minimize test time. According to one embodiment—not shown—the probe card uses standard wafer prober auto-loading.

Also, low-frequency instruments and/or one or more power supplies PS are configured to be coupled to the device under test DUT via pogo pins 165, 170 of the pogo tower 160 and the contact pads of the probe card 100 for exchanging low-frequency, direct current, and/or low-speed digital signals. The segments having the recess region 181 of the probe card 100 and/or recess region 180 of the pogo tower 180 respectively, define when property aligned in at least one common partial area thereof a free space, which permits the reception of a positioning apparatus (not shown, see item 610 of FIG. 6). The positioning apparatus PA is provided for establishing an optical coupling between one or more optical instruments and the device under test DUT, for example, via one or more optical guides—see FIG. 6, 7 for example optical fiber OF cables. The optical guides connect one or more optical instruments, for instance, lasers and/or optical power meters with the device under test DUT. The common partial area of the recess regions is designed in such a way that the positioning apparatus PA can easily access the device under test. Therefore, the common partial area of the recess region's RR extends to a location adjacent to the device under test DUT.

The positioning apparatus PA can, for instance, comprise a movable cantilever arm, which can easily couple the optical guides, for example optical fiber OF cables connected thereto, to the device under test DUT in a reliable way, due to the freedom of movement available to it in the open space defined by the common partial area of the segments PTS. PCS.

Figure 2:
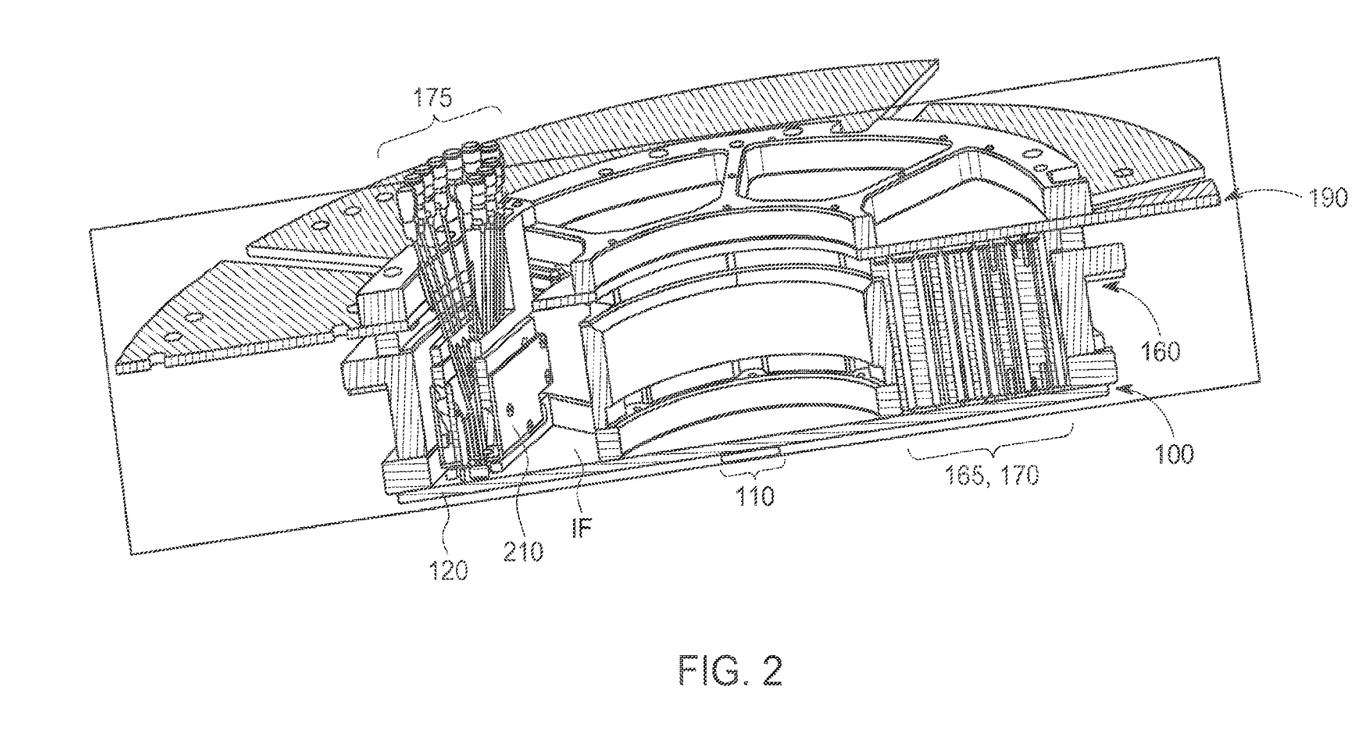
FIG. 2 shows a cross-sectional view of the test fixture setup according to the embodiment of FIG. 1 as assembled.

In FIG. 2, a cross-sectional view of the test fixture setup according to the embodiment of FIG. 1 is shown. To increase the intelligibility, the individual elements/parts of the test fixture setup—with the exception of the coaxial connector—are shown in an over-simplified form. As can be clearly deduced from FIG. 2 with reference to FIG. 1, the pogo tower 160 serves as an interface between the probe card 100 and the wafer probe interface 190. The probe card 100 is connectable to the device under test DUT. The wafer probe interface 190 is designed according to specifics of the automatic test equipment platform/manufacturer. The probe card 100, pogo tower 160, as well as the wafer probe interface 190 are fixed firmly to one another, for example with screws, in order to ensure a secure connection/contact between the different contacting elements, which in the present embodiment of FIG. 2 are mainly pogo pins, e.g., 165, and coaxial connectors 120, 175. The pogo pins PP are grouped in different segments 101-104 and 161-164 respectively. Along with the pogo pins 165, other contacts like power supplies contacts 170 can be grouped together in the different segments. The segments are arranged and designed such that segments 101-104 of the probe card 100, as well as segments 161-164 of the pogo tower 160 and segments of the wafer probe interface 190 can be aligned complementary to each other. Guiding means—not shown—can be further provided for exact alignment to each other. In the embodiment according to FIG. 2, one segment accommodates the coaxial connectors 175. In order to ensure a secure connection with the probe card 100, the coaxial connectors 175 are combined in a socket slot 210 in one of the pogo tower segments 161-164 of the pogo tower 160. The socket slot 210 is configured for blindly mating the coaxial connectors with a corresponding port with one or more coaxial connectors on the probe card 100. According to the embodiment in FIG. 2, high-frequency signals and/or high-speed digital signals, which are transferred by the coaxial connectors 175, are forwarded to the measuring instruments, for example, high-frequency instruments via coaxial cables and vice versa. The high-frequency instruments can be a part of the automatic test equipment or independent modules that can be connected to the coaxial connectors/coaxial cables. In the present embodiment, the coaxial cables of the coaxial connectors 175 are routed via the pogo tower 160 through the wafer probe interface 190 to an automatic test equipment ATE.

Figure 3:
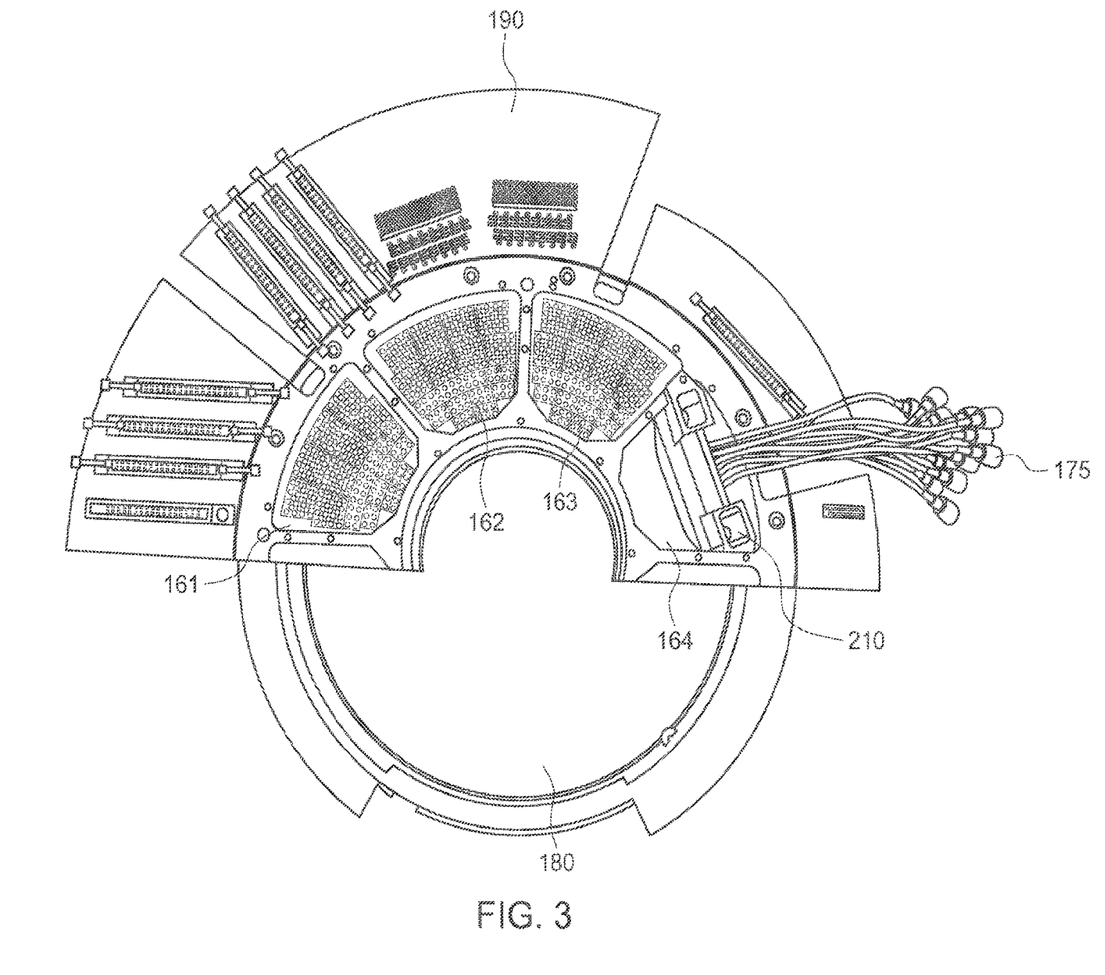
FIG. 3 shows a top view of a pogo tower with a wafer probe interface WPI according to an embodiment of the present invention.

FIG. 3 shows a top view of a pogo tower 160 with the wafer probe interface 190 attached to it. According to the embodiment shown in FIG. 3, three of the pogo tower segments 161, 162, 163 are equipable with pogo pins PP for low-frequency signals which are configured to contact a plurality of contact pads of a probe card—not shown. The pogo pins PP of the pogo tower segments 161, 162, 163 act as an interconnect for low-frequency signals and power supply for the device under test DUT. A fourth segment 164 of the pogo tower 160 is provided with a socket slot 210 therein comprising coaxial cables with coaxial connectors 175 attached thereto. The coaxial connectors 175 are configured to transmit high-frequency signals and/or high-speed digital signals from high-frequency instruments to a probe card. e.g., probe card 100 (FIG. 1)—not shown—which is connectable to the socket slot 210 of the pogo tower 160, hence acting as an interconnection for high-frequency signals. According to the embodiment shown in FIG. 3 the pogo tower 160 as well as the wafer probe interface 190 have a recess region 180 which extend into an area of about a semicircle. The recess region 180 allows for accommodation of a positioning apparatus PA for establishing an optical coupling between one or more optical in instruments and the device under test DUT over one or more optical guides, for example optical fiber OF cables. The recess region 180 can be considered as a silicon/photonic interconnect for the device under test DUT. The recess region 180 according to other embodiments—not shown—may have a shape different from that of a semicircle.

Figure 4:
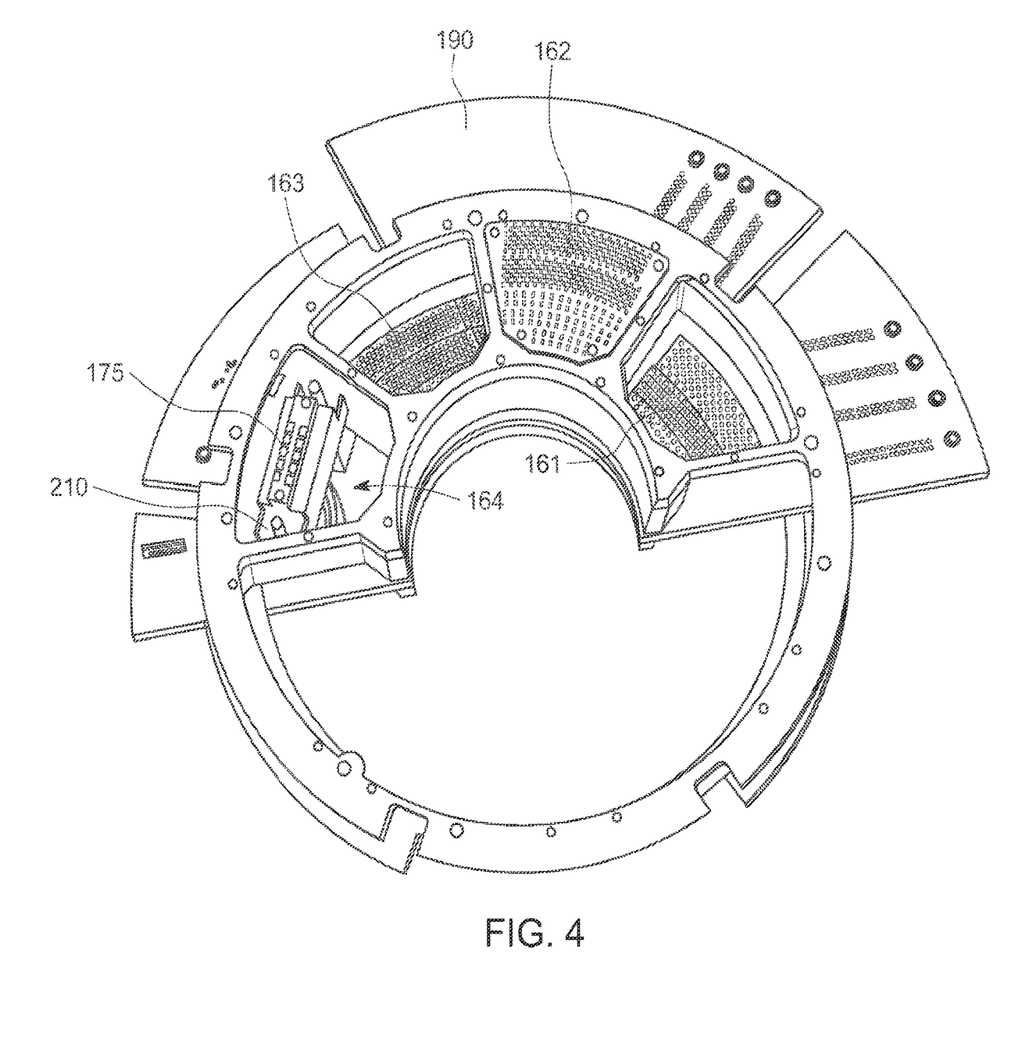
FIG. 4 shows a bottom view of a pogo tower with a connected wafer probe interface according to the embodiment shown in FIG. 3.

FIG. 4 shows a bottom view of the pogo tower 160 with a connected wafer probe interface 190 according to the embodiment shown in FIG. 3. Only one segment 162 of the three pogo tower segments 161, 162, 163 configured for the reception of pogo pins PP contains pogo pins PP in it, while the other two segments 161, 163 are not being used in the present embodiment. The fourth pogo tower segment 164 according to the embodiment shown in FIG. 3 contains the socket slot 210 therein comprising the coaxial cables with the coaxial connectors 175 attached thereto. The socket slot 210 according to the embodiment has a mating coupling connector allowing a secure fixation of the coaxial connectors 175 to a corresponding coupler 510 of a probe card 100—see FIG. 5. One main advantage of such a plug-in connection is that it can be guided and held firmly. Furthermore, a positioning and correct arrangement of the pogo tower 160 relative to the wafer probe interface 190 and probe card 100 attached thereto can be realized by utilizing guide grooves, for example aligning guide grooves on the edge of the pogo tower 160 with guide grooves of the wafer probe interface 190.

Figure 5:
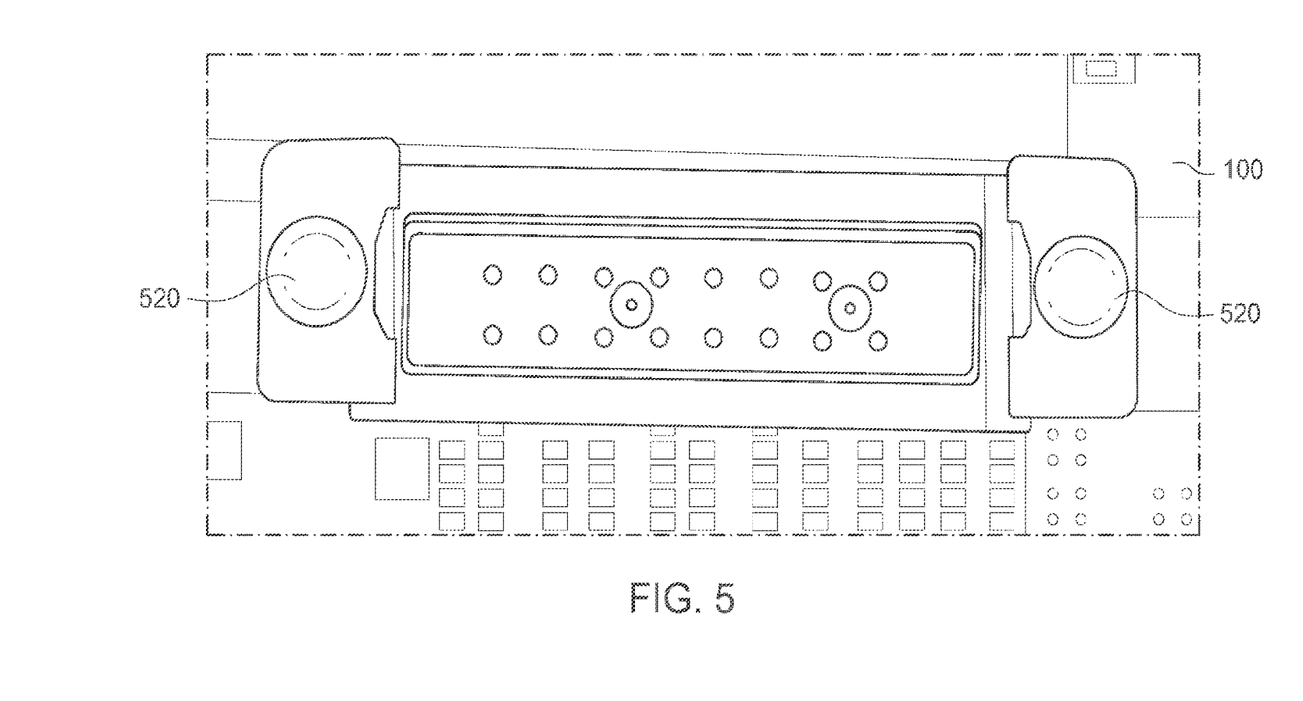
FIG. 5 shows a coupler for coaxial connectors which is configured to mate with corresponding contacts of a socket slot SS of a pogo tower according to an embodiment of the present invention.

FIG. 5 shows a coupler for coaxial connectors 510 which is configured to mate with the corresponding contacts of the socket slot 210 (FIG. 2) of the pogo tower 160 to ensure a secure connection with/to the coaxial connectors 175 (FIG. 2). The coupler is encased in a metal frame and has a positioning aid 520 which ensures correct alignment of the coaxial connectors 175 of the socket slot 210 of the pogo tower 160 when connected to the coupler for coaxial connectors 120 of the probe card 100, which are comprised in the interface IF of the probe card 100.

Figure 6:
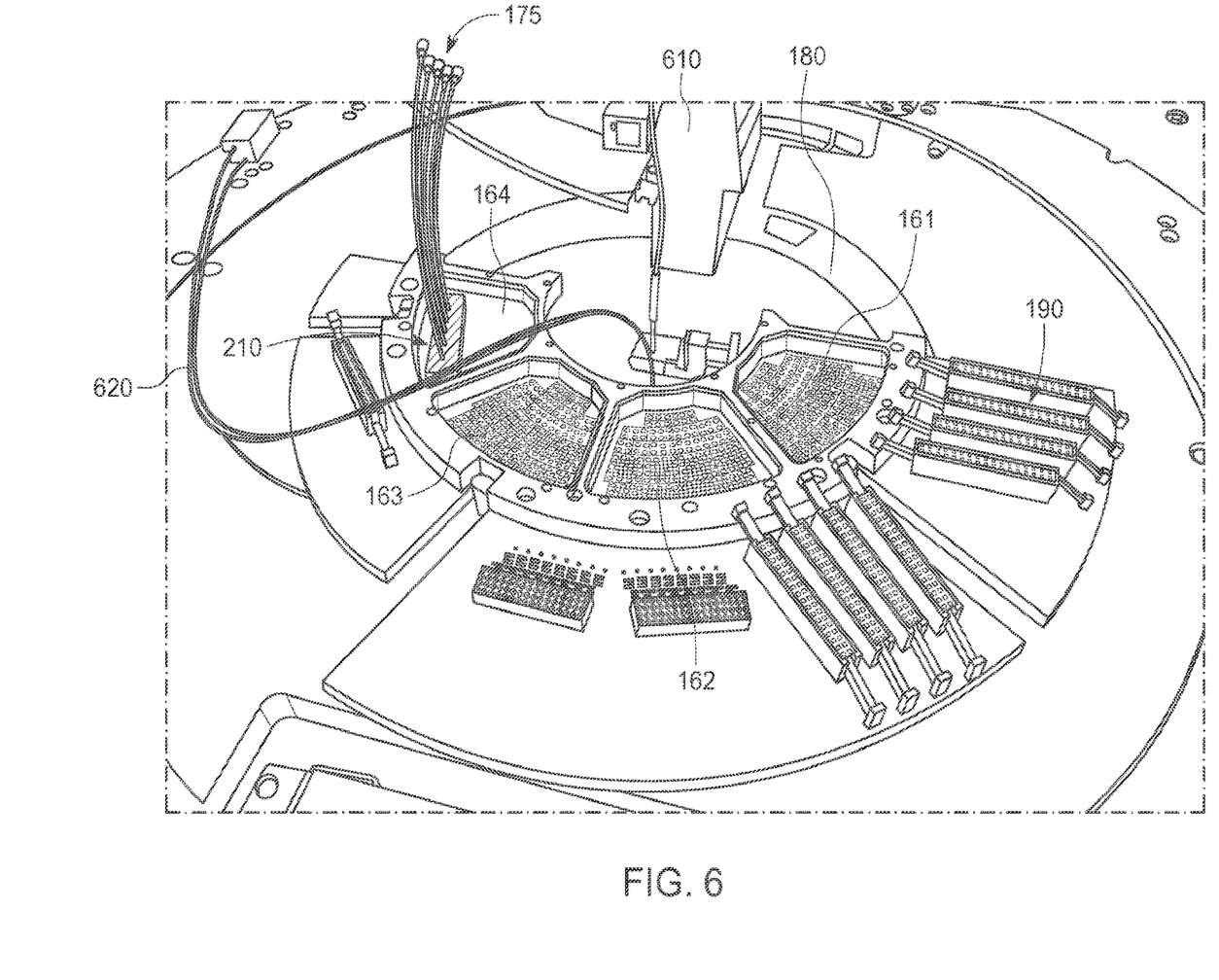
FIG. 6 shows a perspective view a test cell using a wafer probe interface and a pogo tower according to an embodiment of the present invention.
Figure 7:
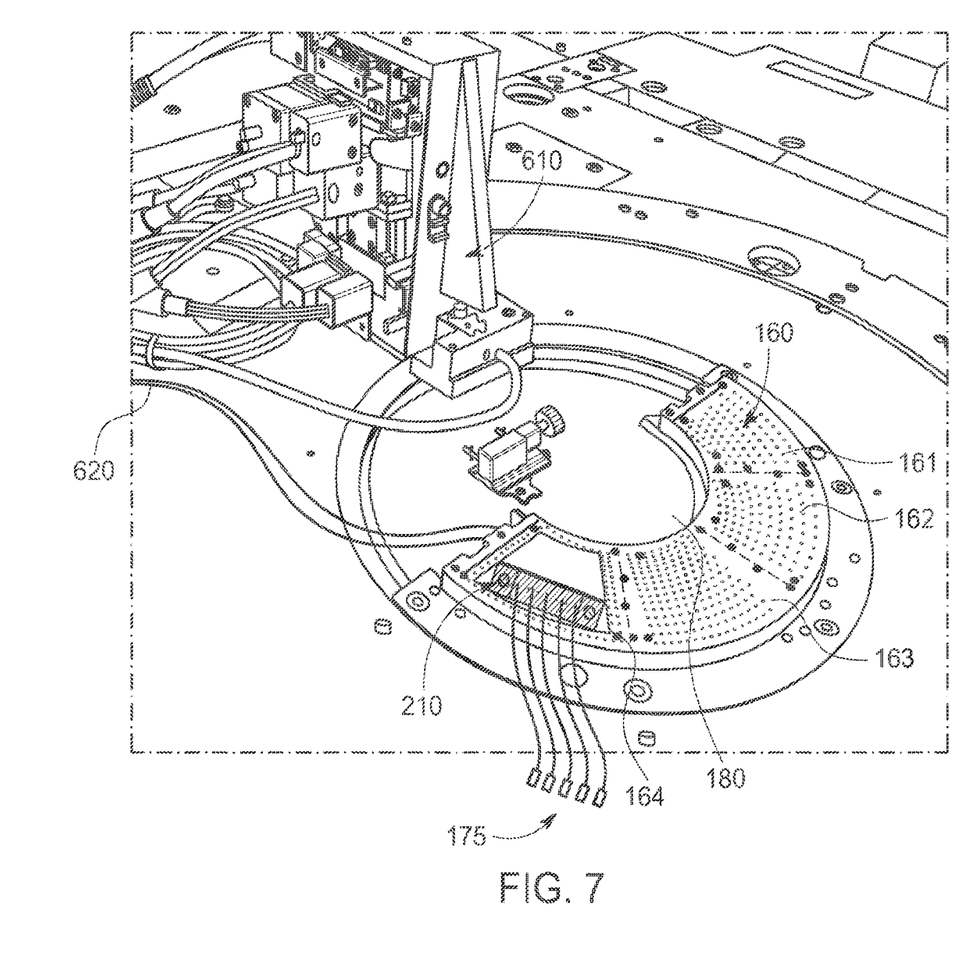
FIG. 7 shows another perspective view of the test cell according to the embodiment of FIG. 6.

FIGS. 6 and 7 show in a perspective view an implementation of a high-volume production silicon photonics test cell using a wafer probe interface 190 and a pogo tower 160 according to the embodiments shown in FIGS. 1 to 5. The embodiment according to FIGS. 6 and 7 can be regarded as a wafer prober with probe card auto-loading having low-speed signaling components which are situated in the pogo tower segments 161, 162, 163 having pogo pins PP and one or more power supplies PS configured to be coupled to the device under test DUT. Above that, a plurality of coaxial connectors 175 are provided, which are concentrated in a socket slot 210 having a metal frame and which is arranged in an additional segment 161 of the pogo tower 160 and/or wafer probe interface 190 to allow high-speed signaling connections. The embodiment of the high-volume production silicon photonics test cell comprises a positioning apparatus 610 for establishing an optical coupling between one or more optical instruments and the device under test DUT via one or more optical guides, for example optical fiber cables 620. The positioning apparatus 610 according to the embodiment of FIGS. 6 and 7 is designed as a cantilever arm, which can be moved in a recess region 180 in which the positioning apparatus 610 is received. According to FIGS. 6 and 7 the coaxial connectors 175 of the coaxial cables of the socket slot 210 protrude from the pogo tower 160 and/or the wafer probe interface 190 in order to be connectable to high-frequency instruments. The high-frequency instruments—not shown—can be extern modularly attachable instruments or instruments included in the silicon photonic test cell or automatic test equipment, respectively. Since the wafer probe interface 190 and/or the pogo tower 160 are normally application independent and designed by an automatic test equipment manufacturer, they can be added, exchanged/replaced and adapted to a specific silicon photonics test cell while increasing the flexibility in use.

In another embodiment—not shown—the coaxial cables of the coaxial connectors CCPT are led from the PT, for example sideways, directly to modules of external measuring/testing devices. This option/solution ensures that legacy automatic test equipment or test cells can still be used and/or upgraded.

On the basis of the above-described arrangement of the different segments of the probe card 100 and the—thereto—connectable pogo tower 160, the automatic test equipment appareled with it can test and/or measure devices under test DUT being a silicon photonics device or conventional semiconductor integrated circuits as well as hybrids between a silicon photonics device and a conventional semiconductor integrated circuit. Automatic test equipment using the above-described arrangement can be configured to test one or more components of the device under test DUT, i.e., one or more low-speed signaling components and/or one or more high-speed signaling components, in sequential/successive mode. Alternatively, or in addition thereto, the above-described automatic test equipment can be operated to test one or more components of the device under test DUT, i.e., one or more low-speed signaling components and/or one or more high-speed signaling components in the simultaneous mode, which considerably increases and improves the application possibilities of the automatic test equipment equipped with the above-described arrangement/test fixture setup.

An alternative embodiment for a wafer probing test fixture design—not shown—is to connect the probe card PC interface IF directly to the test fixture comprising only a probe card PC. Such a probing setup allows the direct coupling/docking of the automatic test equipment to the device under test DUT, bypassing the wafer probe interface WPI printed circuit board and the pogo tower PT as shown in FIG. 1. Thereby, signal performance can be improved and allow high-frequency signaling up to 28 GHz or more. Such a solution can be envisaged when a silicon photonics coupling can be easily performed, such that no extra space/cutout in the probe card is needed for a photonics fiber array positioner to move. Above that, the use of standardized automatic test equipment, or rather standardized automatic test equipment interfaces IF, allows the application of interchangeable instruments modules, therefore, providing a greater flexibility in use, easier customization, and expandability.

With the above described solution/integration of coaxial connectors CCPT and/or CCPC high-speed/high-frequency pins of a silicon photonics integrated circuit or hybrids thereof can easily be measured and/or tested. Above that, the described solution is fully compatible with a standard production pogo tower PT whereby the versatility in use is increased.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above-described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

While the above description contains many specificities, these should not be construed as limitations on the scope, but rather as an exemplification of one [or several] embodiment(s) thereof. Many other variations are possible.

REFERENCES

CCPC coaxial connectors
CCPT coaxial connectors
DUT device under test
IF interface
OF optical fiber
PA positioning apparatus
PC probe card
PCS the probe card segments
PH probe head
PP pogo pins
PS power supply
PT pogo tower
PTS pogo tower segments
RR recess region
SS socket slot with coaxial connectors
WPI wafer probe interface

What is claimed is:

1. A probe card for use with an automatic test equipment, the probe card comprising:
    a body;
    a probe head disposed on a first side of said body, said probe head configured to contact a device under test;
    a void configured for silicon/photonic interconnection to the device under test; and
    a coaxial connector coupled to said probe head and operable to mate with a mating coaxial connector of an interface assembly, said coaxial connector operable to conduct high frequency signals to the probe head.

2. The probe card according to claim 1, wherein said interface assembly comprises pogo pins, and further comprising:
    a plurality of contact pads configured to mate with said pogo pins of said interface assembly.

3. The probe card according to claim 2, wherein the plurality of contact pads is physically and electrically isolated from the coaxial connector.

4. The probe card according to claim 1 further comprising:
    a first plurality of contact pads disposed on a second side said body of said probe card and coupled to said probe head and wherein said first plurality of contact pins is electrically configured to couple to a second plurality of contacts of the interface assembly.

5. The probe card according to claim 1 wherein the coaxial connector is configured for blind mating with the mating coaxial connector.

6. The probe card according to claim 1 wherein the coaxial connector is configured to couple a signal of at least 25 GHz.

7. The probe card according to claim 1 further comprising:
    a semi-circular void.

8. The probe card according to claim 1, wherein said probe card is configured to provide clearance for a positioning apparatus, said positioning apparatus configured to establish an optical coupling between a test instrument and the device under test.

9. The probe card according to claim 8, wherein said positioning apparatus comprises a movable cantilever arm.

10. The probe card according to claim 9, wherein said movable cantilever arm is operable to extend to a location adjacent to the device under test.

11. The probe card according to claim 1, wherein said probe card is configured to pass a plurality of optical cables coupled to said device under test through a void in said probe card.

12. A probe card for use with an automatic test equipment, wherein the probe card is configured to test a device under test,
    wherein the device under test utilizes a plurality of low-frequency signals and a high-frequency signal, the probe card comprising:
    a coaxial connector configured to couple to said high-frequency signal;
    a void configured for silicon/photonic interconnection to the device under test; and
    a plurality of contact pads configured to couple to said plurality of low-frequency signals.

13. The probe card of claim 12, wherein said high-frequency signal is at least 25 GHz.

14. The probe card of claim 12, wherein the coaxial connector is configured for blind mating.

15. The probe card of claim 12, wherein said probe card is configured to provide clearance for a positioning apparatus, said positioning apparatus configured to establish an optical coupling between a test instrument and the device under test.

16. The probe card of claim 15, wherein said positioning apparatus comprises a movable cantilever arm.

17. The probe card of claim 16, wherein said movable cantilever arm is operable to extend to a location adjacent to the device under test.

18. The probe card of claim 12, wherein said probe card is configured to pass a plurality of optical cables coupled to said device under test through a void in said probe card.

\* \* \* \* \*